United States Patent
Yoo et al.

(10) Patent No.: US 9,905,738 B2
(45) Date of Patent: Feb. 27, 2018

(54) COMPOSITION FOR ENCAPSULANT AND ENCAPSULANT AND ELECTRONIC DEVICE

(71) Applicant: SAMSUNG SDI CO., LTD., Yongi-si, Gyeonggi-do (KR)

(72) Inventors: Hong-Jung Yoo, Suwon-si (KR); Young-Ho Kim, Suwon-si (KR); Woo-Han Kim, Suwon-si (KR); Doo-Ri Song, Suwon-si (KR); Eun-Seon Lee, Suwon-si (KR)

(73) Assignee: Samsung SDI Co., Ltd., Yongin-si, Gyeonggi-do (KR)

( * ) Notice: Subject to any disclaimer, the term of this patent is extended or adjusted under 35 U.S.C. 154(b) by 7 days.

(21) Appl. No.: 14/643,620

(22) Filed: Mar. 10, 2015

(65) Prior Publication Data
US 2015/0263249 A1    Sep. 17, 2015

(30) Foreign Application Priority Data

Mar. 11, 2014 (KR) .................. 10-2014-0028467

(51) Int. Cl.

| | |
|---|---|
| *H01L 33/56* | (2010.01) |
| *H01L 33/52* | (2010.01) |
| *C09D 183/06* | (2006.01) |
| *H01B 1/20* | (2006.01) |
| *H01L 33/50* | (2010.01) |
| *C08L 83/04* | (2006.01) |
| *B82Y 30/00* | (2011.01) |
| *C08G 77/12* | (2006.01) |

(Continued)

(52) U.S. Cl.
CPC .............. *H01L 33/56* (2013.01); *C08L 83/04* (2013.01); *H01L 33/501* (2013.01); *C08G 77/12* (2013.01); *C08G 77/20* (2013.01); *C08G 77/80* (2013.01); *H01L 2224/48091* (2013.01)

(58) Field of Classification Search
CPC ....... H01L 33/52; H01L 33/56; C09D 183/06; H01B 1/20; B82Y 30/00
USPC .......... 106/287.14; 252/183.11, 500, 519.31, 252/586; 257/88, 100, E31.117, E33.059; 438/26, 28, 64; 524/588; 525/477, 478; 528/31
See application file for complete search history.

(56) References Cited

U.S. PATENT DOCUMENTS

| | | | |
|---|---|---|---|
| 2003/0029355 A1* | 2/2003 | Miyabayashi | C09D 11/40 106/31.27 |
| 2011/0114315 A1* | 5/2011 | James | C04B 22/12 166/294 |
| 2012/0168815 A1* | 7/2012 | Koh | C08L 83/04 257/100 |

FOREIGN PATENT DOCUMENTS

| | | | |
|---|---|---|---|
| JP | 2008-198951 A | 8/2008 | |
| JP | 2010-006971 A | 1/2010 | |

(Continued)

*Primary Examiner* — Bijan Ahvazi
(74) *Attorney, Agent, or Firm* — Lee & Morse, P.C.

(57) ABSTRACT

Provided are a composition for an encapsulant having a viscosity of about 4,000 to about 9,500 mPa·s when measured using a Brookfield (DV-II+pro) spindle No. 52 at a torque of about 90% under atmospheric pressure at about 23° C., whereby maintaining a phosphor precipitation degree within about 18% when including a phosphor and allowed to stand at about 23° C. for greater than or equal to about 2 hours, and including at least one first siloxane compound having a silicon-bonded hydrogen (Si—H) and at least one second siloxane compound having a silicon- (Continued)

bonded alkenyl group (Si-Vi), an encapsulant obtained by curing the composition, and an electronic device including the encapsulant.

11 Claims, 12 Drawing Sheets

(51) Int. Cl.
*C08G 77/20* (2006.01)
*C08G 77/00* (2006.01)

(56) References Cited

FOREIGN PATENT DOCUMENTS

| | | |
|---|---|---|
| JP | 2010-111811 A | 5/2010 |
| JP | 2012-111836 A | 6/2012 |
| KR | 10-0644881 B1 | 11/2006 |
| KR | 10-2008-0092272 A | 10/2008 |
| KR | 10-2009-0028720 A | 3/2009 |
| KR | 10-2010-0067140 A | 6/2010 |
| KR | 10-2012-0078606 A | 7/2012 |
| TW | 200536157 | 11/2005 |
| TW | 201219455 | 5/2012 |
| TW | 201231559 | 8/2012 |
| WO | WO 2012/175466 A1 | 12/2012 |
| WO | WO 2014/019188 A1 | 2/2014 |

\* cited by examiner

COMPOSITION FOR ENCAPSULANT AND ENCAPSULANT AND ELECTRONIC DEVICE

CROSS-REFERENCE TO RELATED APPLICATION

Korean Patent Application No. 10-2014-0028467, filed on Mar. 11, 2014, in the Korean Intellectual Property Office, and entitled: "Composition for Encapsulant and Encapsulant and Electronic Device," is incorporated by reference herein in its entirety.

BACKGROUND

1. Field

Embodiments relate to a composition for an encapsulant, an encapsulant, and an electronic device including the encapsulant.

2. Description of the Related Art

Light emitting devices such as a light emitting diode (LED), an organic light emitting diode device (OLED), a photoluminescent (PL) device, and the like has been variously applied to a domestic electric device, a lighting device, a display device, various automatic devices, and the like.

The light emitting device may display colors of a light emitting material such as blue, red, and green in a light emission part, or white by combining light emitters displaying different colors. Such a light emitting device may generally include an encapsulant having a packaging or encapsulation structure. The encapsulant may protect the light emitting device from external gas and moisture and externally transmit light at various wavelengths emitted from the light emitting device.

SUMMARY

Embodiments are directed to a composition for an encapsulant, the composition including a first siloxane compound having a silicon-bonded hydrogen, and a second siloxane compound having a silicon-bonded alkenyl group. The composition may have a viscosity of about 4,000 to about 9,500 mPa·s when measured using a Brookfield (DV-II+pro) spindle No. 52 at a torque of about 90% under atmospheric pressure at about 23° C., and the composition, when combined with a predetermined phosphor and allowed to stand at about 23° C. for greater than or equal to about 2 hours, may exhibit a phosphor precipitation degree of about 18% or less.

The predetermined phosphor used to determine the phosphor precipitation degree may have a density of about 3.5 g/cm³ to about 6.5 g/cm³.

The phosphor precipitation degree may be determined by measuring a light back scattering spectrum of a mixture of the composition and the predetermined phosphor, the light back scattering spectrum being evaluated in a vertical direction over time using a Turbiscan equipment, comparing each measurement value with an initial spectrum, and evaluating the changed degree.

The composition may have a transmittance, after curing the composition, of greater than or equal to about 90% at a wavelength of about 450 nm.

The composition may have a refractive index, before curing the composition, of greater than or equal to about 1.40 at 589 nm.

The first siloxane compound may be represented by Chemical Formula 1:

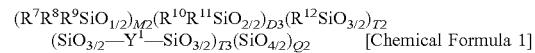

[Chemical Formula 1]

In Chemical Formula 1, $R^7$ to $R^{12}$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^7$ to $R^{12}$ includes hydrogen, $Y^1$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, $0<M2<1$, $0\leq D3<1$, $0\leq T2<1$, $0\leq T3<1$, $0\leq Q2<1$, and $M2+D3+T2+T3+Q2=1$.

At least one of the $R^7$ to $R^{12}$ may include a substituted or unsubstituted C6 to C30 aryl group.

The second siloxane compound may be represented by Chemical Formula 2:

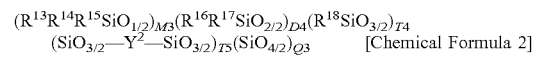

[Chemical Formula 2]

In Chemical Formula 2, $R^{13}$ to $R^{18}$ are independently a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^{13}$ to $R^{18}$ includes a substituted or unsubstituted C2 to C30 alkenyl group, $Y^2$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, $0<M3<1$, $0\leq D4<1$, $0\leq T4<1$, $0\leq T5<1$, $0\leq Q3<1$, and $M3+D4+T4+T5+Q3=1$.

At least one of the $R^{13}$ to $R^{18}$ may include a substituted or unsubstituted C6 to C30 aryl group.

The first siloxane compound may be included in an amount of less than about 50 wt % based on the total amount of the first siloxane compound and the second siloxane compound, and the second siloxane compound may be included in an amount of greater than about 50 wt % based on the total amount of the first siloxane compound and the second siloxane compound.

Embodiments are also directed to a phosphor-containing mixture, including the composition according to an embodiment; and a phosphor having a density of about 3.5 g/cm³ to about 6.5 g/cm³, the phosphor being present in an amount of about 5% to about 40% based on the weight of the composition.

The mixture may have a viscosity of about 4,000 to about 10,000 mPa·s when measured using a Brookfield (DV-II+pro) spindle No. 52 at a torque of about 90% under atmospheric pressure at about 23° C.

Embodiments are also directed to an encapsulant obtained by curing the composition according to an embodiment.

Embodiments are also directed to an electronic device including the encapsulant according to an embodiment.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
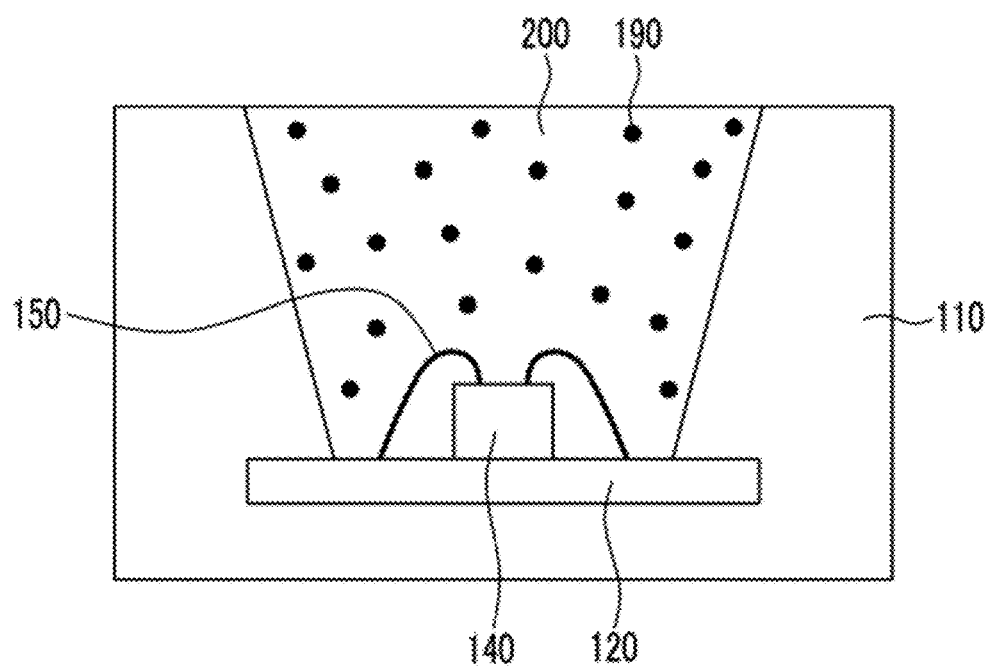
FIG. 1 illustrates a schematic cross-sectional view showing a light emitting diode according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

In the specification, when a definition is not otherwise provided, the 'substituted' refers to one substituted with a substituent selected from a halogen atom (F, Br, Cl, or I), a hydroxy group, an alkoxy group, a nitro group, a cyano group, an amino group, an azido group, amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof, instead of hydrogen of a compound.

In the specification, when a definition is not otherwise provided, "hetero" refers to one including 1 to 3 heteroatoms selected from N, O, S, and P.

Hereinafter, a composition for an encapsulant according to an embodiment is described.

The composition for an encapsulant according to an embodiment has a viscosity ranging from about 4,000 to about 9,500 mPa·s when measured using a Brookfield (DV-II+pro) spindle No. 52 and at torque of about 90% under atmospheric pressure at about 23° C., and maintains a phosphor precipitation degree within about 18% including phosphor and allowed to stand at about 23° C. for about 2 hours, and includes at least one first siloxane compound having a silicon-bonded hydrogen (Si—H) and at least one second siloxane compound having a silicon-bonded alkenyl group (Si-Vi).

A light emitting device such as a light emitting diode (LED), an organic light emitting diode (OLED) device, a photoluminescence device (PL device) may display intrinsic colors of light emitting materials such as blue, red, and green in the light emitting part. When adding phosphor into the encapsulant in order to provide a white light device, the phosphor may convert blue light emitted from the LED chip into green, yellow, red or the like, so it may display white light by combining the several colored lights. Specifically, a solid phosphor is mixed with a generally liquid encapsulant and defoamed, and the mixture is coated on the upper end of package connected with a LED chip and cured to provide a light emitting device. The mixture is introduced into a syringe or the like and coated on the LED chip. If solid phosphor has a higher density than the liquid encapsulant, the phosphor may precipitate in the encapsulant in a lapse of time by the fluidity of liquid encapsulant before the curing. Accordingly, even though the light emitting device is fabricated using a mixture including the same encapsulant and phosphor, the phosphor concentration in the encapsulant in the bottom part of syringe may increase with a lapse of time, so the phosphor content may be different between the early produced light emitting device and the later produced light emitting device. The phosphor content difference may cause a color difference among devices, so that the mixture of encapsulant and phosphor and the light emitting device fabricated from the same may not be ensured to have reliability.

According to the embodiments, a composition for an encapsulant may provide a light emitting device suppressing the phosphor precipitation in less than or equal to a predetermined range for at least a predetermined time by maintaining the density of the liquid encapsulant within a predetermined range; and minimizing the phosphor content difference among the devices fabricated therefrom and the color difference caused thereby.

As the phosphor precipitation may be caused, at least in part, by the density difference between phosphor and the liquid encapsulant, the phosphor may not be precipitated if the phosphor and the encapsulant have the same density. However, practically, the liquid encapsulant and the solid-phase phosphor may not have a density within the same range, and if the density of encapsulant is maintained within the similar range to the density of phosphor, it may not be suitable for coating on the LED chip through a syringe. Generally, the density of liquid encapsulant ranges from about 1.0 g/cm$^3$ to about 1.5 g/cm$^3$, and the density of phosphor suitable for fabricating a light emitting device ranges from about 3.5 g/cm$^3$ to about 6.5 g/cm$^3$. Accordingly, based on the density of the encapsulant and phosphor, the viscosity may satisfy the conditions that the mixture of phosphor and encapsulant is coated on the LED chip through a syringe and that the phosphor precipitation is suppressed in the mixture for the coating period. The composition for an encapsulant according to the present example embodiment provides a viscosity range satisfying the requirements.

The viscosity range may be changed depending upon the density ranges of the phosphor and encapsulant. Thus, the viscosity range of the composition for an encapsulant may be modified or controlled to suppress the phosphor precipitation in the encapsulant considering the changed density ranges when the density ranges of phosphor or encapsulant are out of the range.

Phosphor may be precipitated in the encapsulant in a lapse of time unless phosphor and encapsulant have the completely same density. However, the phosphor precipitation may be suppressed within a predetermined range during a predetermined time for mixing the encapsulant and phosphor and coating the same on the LED chip. In this case, if the precipitating degree of phosphor is within 18% of the initial value when the mixture of the composition for an encapsulant is allowed to stand at about 23° C. for greater than or equal to about 2 hours, the light emitting device fabricated from the same little has a color difference among devices.

The precipitation degree of phosphor may be obtained by measuring a light back scattering spectrum of the mixture of the composition and phosphor in a vertical direction to the horizontal surface by using a Turbiscan equipment or the like in a lapse of time; and comparing each the measured value with the initial spectrum and evaluating the changed degree. Specifically, the mixture is introduced into a vial only for Turbiscan and measured for the light back scattering intensity using a Turbiscan equipment in a predetermined time interval (5 minutes or 10 minutes) right after the mixing according to the height of vial to find a spectrum, and then the subsequent time interval results are compared with the initial spectrum measurement value to provide the precipitation degree. Accordingly, when the light back scattering spectrum value measured after a predetermined time is same as the initial measurement value, it means that precipitation degree is 0%.

FIGS. 2 to 7 are each a light back scattering spectrum showing the precipitating degree of phosphor in the mixture according to the time when the compositions for an encapsulant according to Comparative Examples and Examples are mixed with phosphor.

Figure 2:
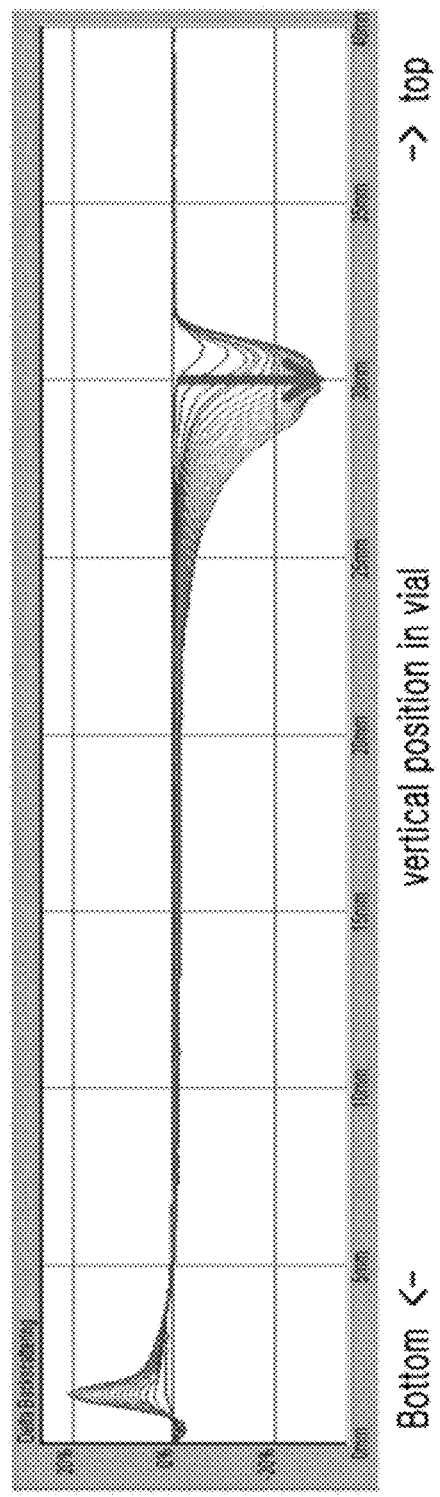
FIGS. 2 to 4 respectively illustrate light back scattering spectra showing the precipitation degree of phosphor in a direction vertical to the horizontal surface when the compositions for an encapsulant according to Comparative Examples 1-3 are mixed with phosphor and allowed to stand at 23° C. for 2 hours.
Figure 3:
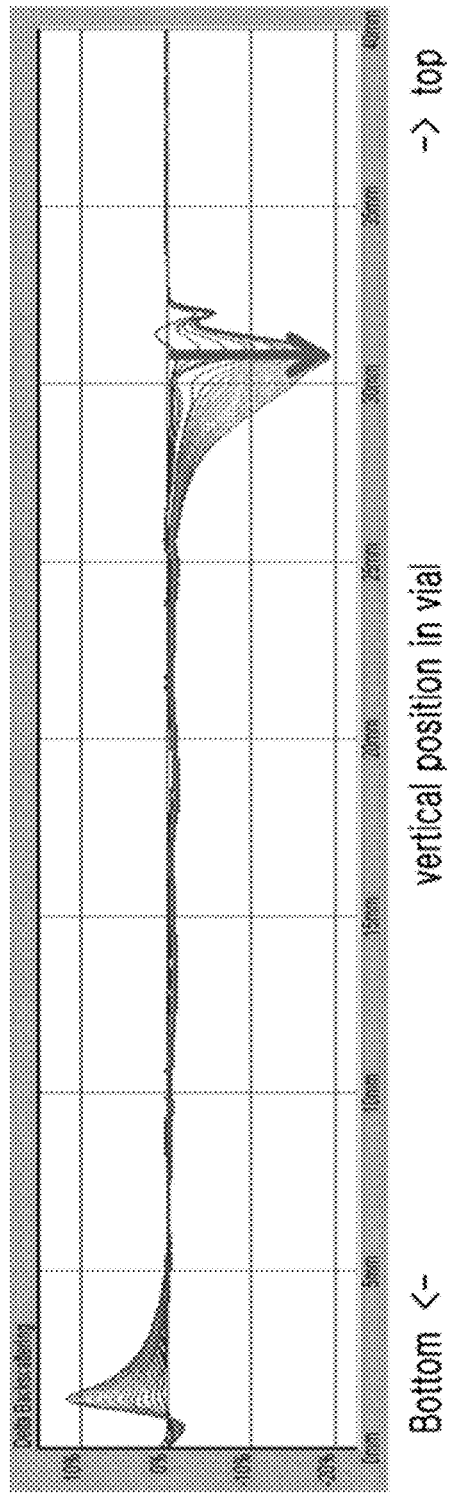
Figure 4:
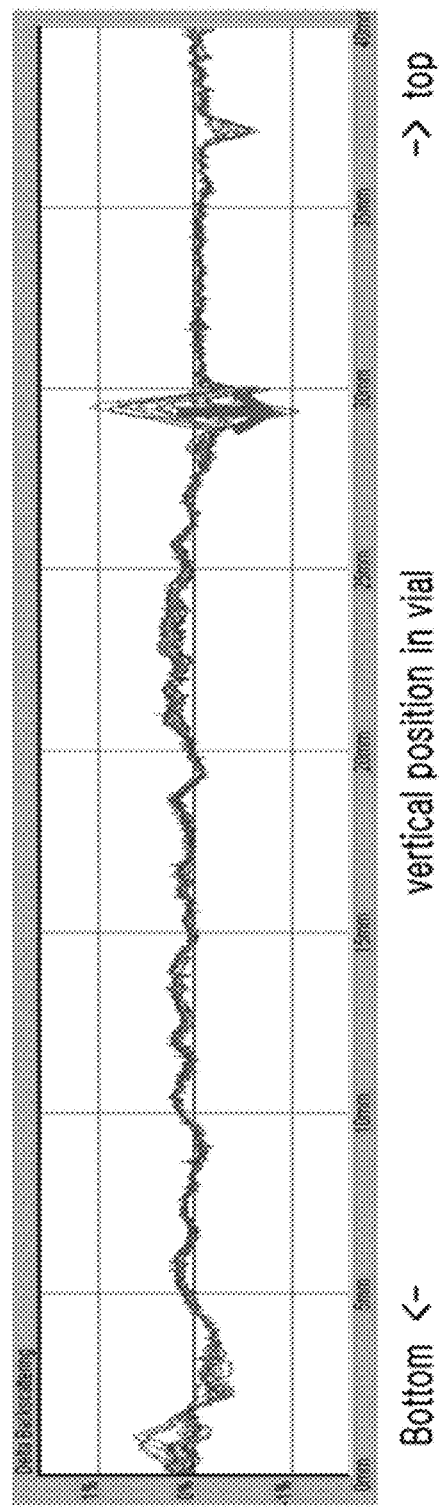

Specifically, FIGS. 2 to 4 show how the phosphor is precipitated according to the position in the vial in a vertical direction to the horizontal surface in a lapse of time when the compositions for an encapsulant according to respective Comparative Examples 1-3 are introduced into a vial only for Turbiscan and each mixed with phosphor in a predetermined amount and allowed to stand at 23° C. for 2 hours; which shows that the light back scattering spectrum intensity is changed in the arrow direction in each position of the vial since the concentration is changed by precipitating phosphor.

Figure 5:
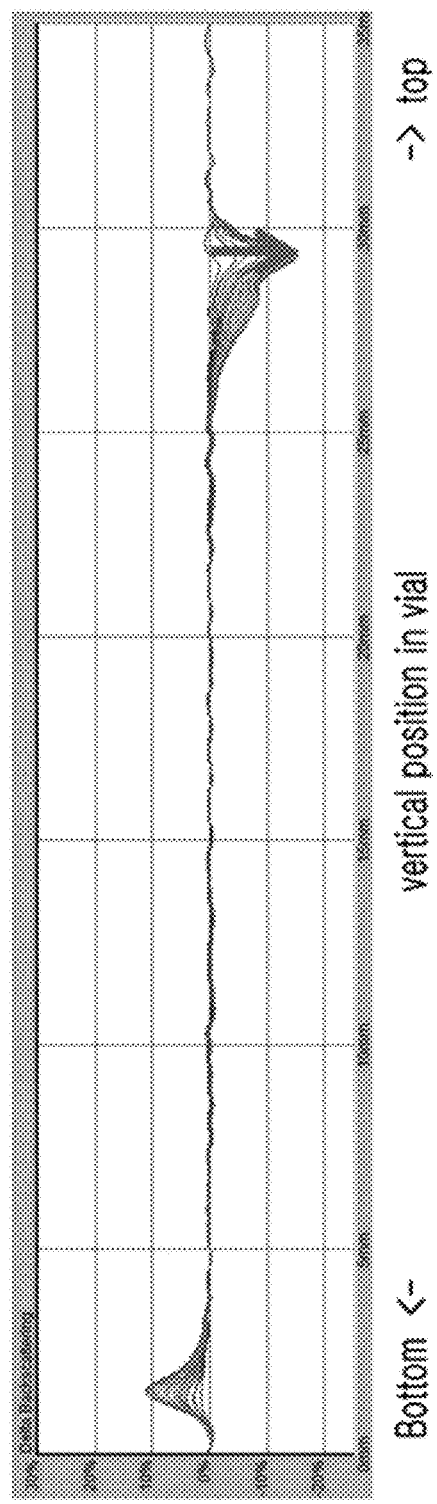
FIGS. 5 to 7 respectively illustrate light back scattering spectrums showing the precipitation degree of phosphor in a direction vertical to the horizontal surface when the compositions for an encapsulant according to Examples 1-3 are mixed with phosphor and allowed to stand at about 23° C. for about 2 hours.
Figure 6:
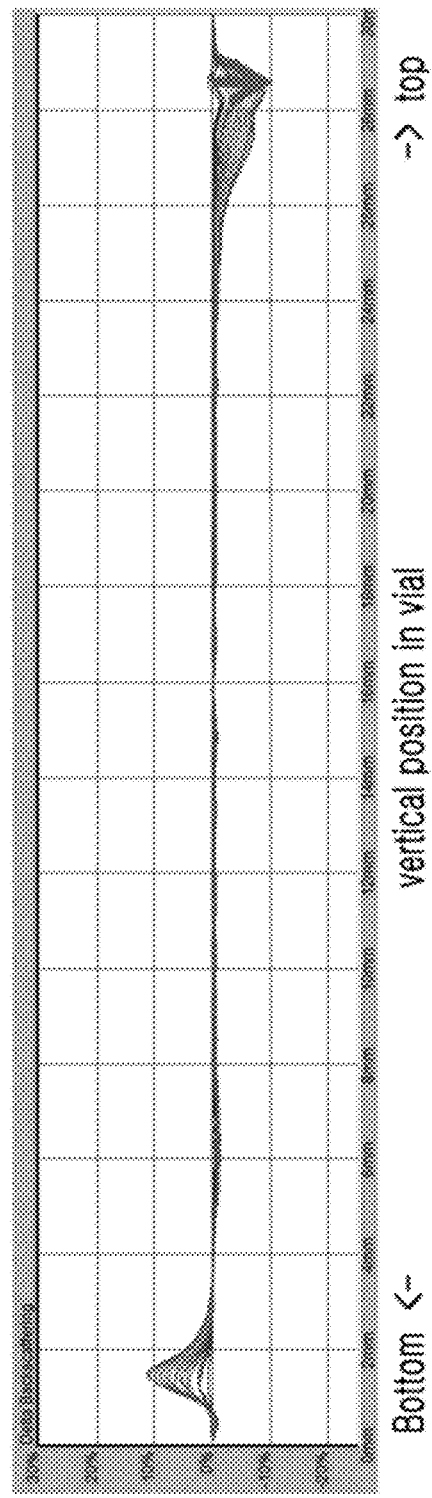
Figure 7:
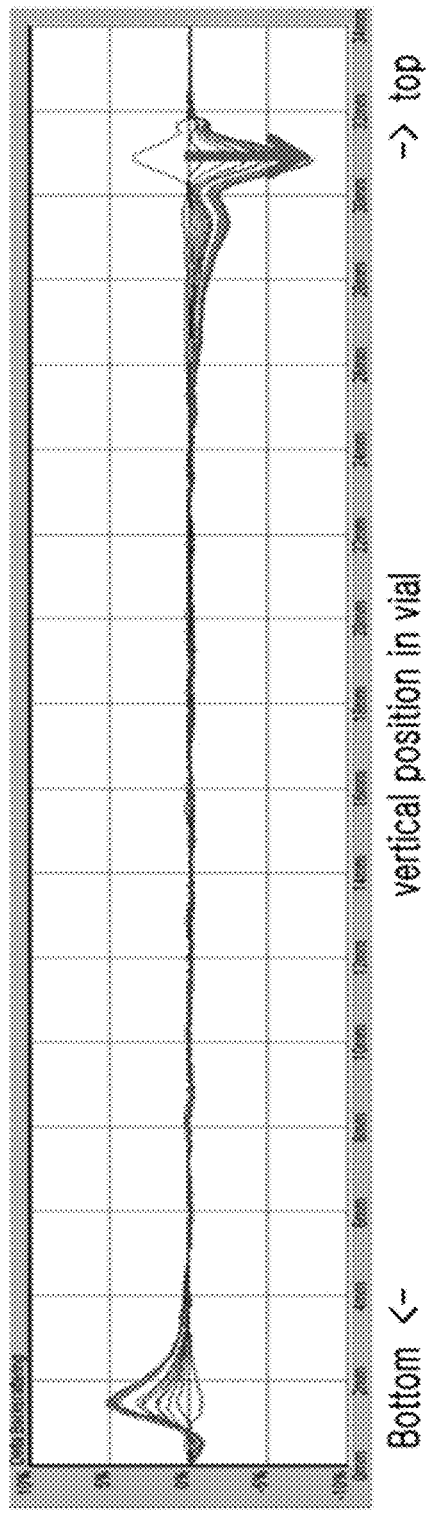

FIGS. 5 to 7 are each a light back scattering spectrum showing how phosphor is precipitated according to the position in a vial only for Turbiscan in a vertical direction to the horizontal surface in a lapse of time when the compositions for an encapsulant according to respective Examples 1-3 are mixed with phosphor in accordance with the same procedure as in Comparative Examples 1-3.

FIGS. 5 to 7 also show that the light back scattering spectrum intensity is changed in the arrow direction in each position in the vial since the concentration is changed by precipitating phosphor in a lapse of time.

FIGS. 8 to 12 are graphs showing the color distribution difference according to the time among devices when a plurality of light emitting devices are fabricated with the mixtures of phosphor and each of the compositions for an encapsulant according to Comparative Examples and Examples in a predetermined time interval and measured for the color coordinate among the light emitting devices.

As understood from FIGS. 2 to 7, when the mixtures according to Examples 1-3 satisfying the viscosity range according to the present example embodiment are used, all the phosphor precipitation degrees were within about 18% in a lapse of time. On the other hand, in the case of Comparative Examples 1-3 having a viscosity out of the range, the phosphor precipitation degrees in the mixture were very high. In addition, as understood from FIGS. 8 to 12, the color distribution of the light emitting devices fabricated with the compositions for an encapsulant according to Examples 1-3 was narrow among devices in a lapse of time. On the other hand, the color distribution of the light emitting devices fabricated with the compositions according to Comparative Examples 1-2 was wide among devices according to the time difference. In addition, the case of Comparative Example 3 had too high viscosity to fabricate a light emitting device.

The phosphor may be included in a range from about 5% to about 40%, for example, from about 10% to about 30%, based on the weight of composition for an encapsulant. The phosphor content may be suitably adjusted according to the kind of phosphor and the desirable light emitting degree. When the phosphor is included in the composition in an amount of about 5 wt % to about 40 wt %, the mixture may have a viscosity of about 4,000 to 10,000 mPa·s when measured using a Brookfield (DV-II+pro) spindle No. 52 at torque of about 90% under atmospheric pressure at 23° C., which is the viscosity range capable of easily coating the mixture on the package through a syringe.

A specimen cured with the composition for an encapsulant in a thickness of about 4 mm may have a transmittance of greater than or equal to about 90%, for example, greater than or equal to about 95%, at a wavelength of about 450 nm. The transmittance may have a range effectively transmitting light of light emitting device, and the composition for an encapsulant according to the embodiment may be suitable for a light emitting device.

In addition, the composition may have a refractive index of greater than or equal to about 1.40, for example, greater than or equal to about 1.45, for example, greater than or equal to about 1.50, before curing at i-line (589 nm). In order to improve the intensity of light emitted from the LED chip, the refractive index may be greater than or equal to about 1.50 after curing the encapsulant. The composition for an encapsulant according to the present example embodiment may have a refractive index satisfying the range after curing.

The composition for an encapsulant may be prepared based on an organopolysiloxane to provide an encapsulant, and the organopolysiloxane may include at least one first siloxane compound having a silicon-bonded hydrogen (Si—H) and at least one second siloxane compound having a silicon-bonded alkenyl group (Si-Vi).

The first siloxane compound and the second siloxane compound may be reacted using a hydrosilylation reaction to form a larger and denser polysiloxane structure having a higher molecular weight when curing the composition for an encapsulant, so as to protect a light emitting device from extraneous moisture and gas.

The first siloxane compound may be represented by Chemical Formula 1.

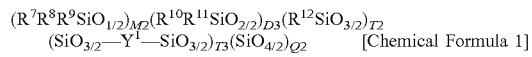   [Chemical Formula 1]

In Chemical Formula 1, $R^7$ to $R^{12}$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^7$ to $R^{12}$ includes hydrogen, $Y^1$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, 0<M2<1, 0≤D3<1, 0≤T2<1, 0≤T3<1, 0≤Q2<1, and
M2+D3+T2+T3+Q2=1.

The first siloxane compound has a silicon-bonded hydrogen (Si—H), and may include, for example an average of two or more silicon-bonded hydrogen (Si—H) per molecule. The silicon-bonded hydrogen (Si—H) may react with an alkenyl group of a surface-modifying agent and/or an alkenyl group of the second siloxane compound described below.

The first siloxane compound may be obtained by hydrolysis and condensation polymerization of at least one selected from, for example a monomer represented by $R^7R^8R^9SiZ^{11}$, a monomer represented by $R^{10}R^{11}SiZ^{12}Z^{13}$, a monomer represented by $R^{12}SiZ^{14}Z^{15}Z^{16}$, a monomer represented by $Z^{17}Z^{18}Z^{19}Si—Y^1—SiZ^{20}Z^{21}Z^{22}$, and a monomer represented by $SiZ^{23}Z^{24}Z^{25}Z^{26}$. Herein, $R^7$ to $R^{12}$ are the same as defined above, and $Z^{11}$ to $Z^{26}$ are independently a C1 to C6 alkoxy group, a hydroxy group, a halogen, a carboxyl group, or a combination thereof.

At least one of the $R^7$ to $R^{12}$ may include a substituted or unsubstituted C6 to C30 aryl group. Accordingly, optical properties may be secured by increasing a refractive index.

One or two or more of the first siloxane compound may be used.

The second siloxane compound may be represented by Chemical Formula 2.

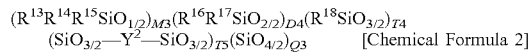   [Chemical Formula 2]

In Chemical Formula 2, $R^{13}$ to $R^{18}$ are independently a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^{13}$ to $R^{18}$ includes a substituted or unsubstituted C2 to C30 alkenyl group, $Y^2$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, 0<M3<1, 0≤D4<1, 0≤T4<1, 0≤T5<1, 0≤Q3<1, and
M3+D4+T4+T5+Q3=1.

The second siloxane compound has a silicon-bonded alkenyl group (Si-Vi), and may include, for example, an average two or more silicon-bonded alkenyl group (Si-Vi)s per molecule. The silicon-bonded alkenyl group (Si-Vi) may react with a hydrogen of a surface-modifying agent and/or a hydrogen of the first siloxane compound.

The second siloxane compound may be obtained by hydrolysis and condensation polymerization of at least one selected from, for example, a monomer represented by $R^{13}R^{14}R^{15}SiZ^{27}$, a monomer represented by $R^{16}R^{17}SiZ^{28}Z^{29}$, a monomer represented by $R^{18}SiZ^{30}Z^{31}Z^{32}$, a monomer represented by $Z^{33}Z^{34}Z^{35}Si—Y^2—SiZ^{36}Z^{37}Z^{38}$, a monomer represented by $SiZ^{39}Z^{40}Z^{41}Z^{42}$. Herein, $R^{13}$ to $R^{18}$ are the same as defined above, and $Z^{27}$ to $Z^{42}$ are independently a C1 to C6 alkoxy group, a hydroxy group, a halogen, a carboxyl group, or a combination thereof.

At least one of the $R^{13}$ to $R^{18}$ may include a substituted or unsubstituted C6 to C30 aryl group. Accordingly, optical properties may be secured by increasing a refractive index.

One or two or more of the second siloxane compound may be used.

The first siloxane compound and the second siloxane compound may have each weight average molecular weight of about 100 g/mol to 30,000 g/mol.

The first siloxane compound may be included in an amount of less than about 50 wt % based on the total amount of the first siloxane compound and the second siloxane compound, and the second siloxane compound may be included in an amount of greater than about 50 wt % based on the total amount of the first siloxane compound and the second siloxane compound.

The composition for an encapsulant may further include a filler.

The filler may include, for example, one or more of an inorganic oxide, for example silica, alumina, titanium oxide, zinc oxide, or a combination thereof.

The composition for an encapsulant may further include a hydrosilylation catalyst.

The hydrosilylation catalyst may promote a hydrosilylation reaction of the first siloxane compound and the second siloxane compound, and may include, for example, platinum, rhodium, palladium, ruthenium, iridium, or a combination thereof.

The hydrosilylation catalyst may be included in an amount of about 0.1 ppm to 1000 ppm based on the total amount of the composition for an encapsulant.

The composition for an encapsulant may be heat-treated and cured at a predetermined temperature, and thus may be used as an encapsulant. The encapsulant may be used for, for example, an electronic device, such as a light emitting diode and an organic light emitting diode device.

Hereinafter, a light emitting diode as one example of an electronic device manufactured by applying an encapsulant according to an embodiment is illustrated referring to FIG. 1.

FIG. 1 is a schematic cross-sectional view showing a light emitting diode according to an embodiment.

Referring to FIG. 1, the light emitting diode includes a mold 110; a lead frame 120 disposed inside the mold 110; a light emitting diode chip 140 mounted on the lead frame 120; a bonding wire 150 connecting the lead frame 120 to the light emitting diode chip 140; and an encapsulant 200 covering the light emitting diode chip 140.

The encapsulant 200 is obtained by curing the composition for an encapsulant. The encapsulant 200 is formed from the composition according to an embodiment and, thus, may protect the light emitting diode chip 140 effectively and prevent the performance of the light emitting diode from being deteriorated.

A phosphor 190 may be dispersed in the encapsulant 200. The phosphor 190 includes a material excited by light and emitting light within its intrinsic wavelength range, for example, a quantum dot such as a semiconductor nanocrystal. The phosphor 190 may include, for example, a mixture of two or more selected from blue phosphor, green phosphor, or red phosphor.

The phosphor 190 may display a color in a predetermined wavelength region by light supplied from the light emitting diode chip 140 as a light emission part, and the light emitting diode chip 140 may display a color in a shorter wavelength region than the color displayed by the phosphor 190. For example, when the phosphor 190 displays red, the light emitting diode chip 140 may display blue or green having a shorter wavelength region than the red.

In addition, the color emitted from the light emitting diode chip 140 may be combined with the color emitted from the phosphor 190 and, thus, display white. For example, when the light emitting diode chip 140 supplies blue light while the phosphor 190 includes a red phosphor and a green phosphor, the electronic device may combine blue, red, and green, and may display white.

The phosphor 190 may be omitted.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLE

Synthesis of Siloxane Compounds

Synthesis Example 1

Synthesis of a First Siloxane Compound 1 kg of a mixed solvent in which water and toluene were mixed at a weight ratio of 5:5 was introduced into a 3-neck flask and dripped with a mixture including tetramethyl disiloxane and diphenyldichlorosilane at a mole ratio of 5:1 for 2 hours as a monomer while maintaining at 23° C. After completing the dripping, a condensation polymerization reaction was performed with heating and refluxing at 90° C. for 3 hours. Subsequently, a polymer solution dissolved in toluene was prepared by removing the aqueous layer after cooling the same at room temperature. The obtained polymer solution was cleaned with water to remove a reaction byproduct of chlorine. Subsequently, the neutral polymer solution was distilled under the reduced pressure to remove toluene, thus a siloxane compound represented by the following Chemical Formula 3 was provided.

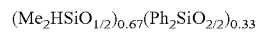  [Chemical Formula 3]

Synthesis Example 2

Synthesis of a First Siloxane Compound 1 kg of a mixed solvent in which water and toluene were mixed at a weight ratio of 5:5 was introduced into a 3-neck flask and then dripped with a mixture including tetramethyl disiloxane and phenyltrichlorosilane at a mole ratio of 8:1 as a monomer for 2 hours while maintaining at 23° C. After completing the drip, a condensation polymerization reaction was performed while heating and refluxing at 90° C. for 3 hours. Subsequently, after cooling at room temperature, the aqueous layer was removed to provide a polymer solution dissolved in toluene. The obtained polymer solution was cleaned with water to remove a reaction byproduct of chlorine. Subsequently, the neutral polymer solution was distilled under the reduced pressure to remove toluene, thereby a siloxane compound represented by the following Chemical Formula 4 was obtained.

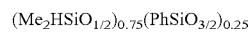  [Chemical Formula 4]

Synthesis Example 3

Synthesis of a Second Siloxane Compound 1 kg of a mixed solvent in which water and toluene were mixed at a weight ratio of 5:5 was introduced into a 3-neck flask and then dripped with a mixture of vinyldimethylchlorosilane, phenylmethyldichlorosilane, and phenyltrichlorosilane as a monomer at a mole ratio of 15:25:60 for 2 hours while maintaining at 23° C. After completing the dripping, a condensation polymerization reaction was performed with heating and refluxing at 90° C. for 3 hours. Subsequently, after cooling at a room temperature, the aqueous layer was removed to provide a polymer solution dissolved in toluene. The obtained polymer solution was cleaned with water to remove a reaction byproduct of chlorine. Subsequently, the neutral polymer solution was distilled under the reduced pressure to remove toluene, thus a siloxane compound represented by the following Chemical Formula 5 was obtained.

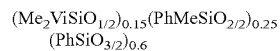  [Chemical Formula 5]

Preparation of Compositions for Encapsulant

Examples 1 to 3 and Comparative Examples 1 to 3

Siloxane compounds represented by Chemical Formula 3 to Chemical Formula 5 obtained from Synthesis Example 1 to Synthesis Example 3 were mixed according to the composition shown in the following Table 1 based on the total weight of siloxane compounds in each Example and Comparative Example and added with a hydrosilylation catalyst Pt-CS 2.0 (manufactured by Umicore) to provide 5 ppm based on the total weight, and then these mixtures were evaporated and defoamed to provide compositions for an encapsulant according to Examples 1 to 3 and Comparative Examples 1 to 3.

The obtained compositions for an encapsulant were measured for a viscosity, a phosphor precipitation degree when mixing phosphor with the composition for an encapsulant, a process pressure of the composition for an encapsulant, a refractive index, and a color coordinate or the like according to the following descriptions, and the results are shown in Table 1 as below.

Viscosity measurement: the viscosity before and after mixing phosphor with the composition for an encapsulant was measured based on the viscosity measured using a Brookfield (DV-II+pro) spindle No. 52 at a torque of 90% at 23° C.

Refractive index measurement: composition for an encapsulant as a liquid composition formulation before curing was measured using Abbe refractive index measurer under D-line (589 nm) wavelength.

Color coordinate variation ratio: phosphor having a density of 5.03 g/cm$^3$ was added into the composition for an encapsulant in a ratio of 19% based on the weight of the composition for an encapsulant and mixed and defoamed by using ARV-310 (manufactured by Thinky) at 2,000 rpm for 1.5 minutes, and at 800 rpm for 3.5 minutes. The mixture was moved to a distribution syringe, and coated on five LED packages for a predetermined amount in a regular time interval (5 or 10 minutes) right after the mixing to provide a light device product. Each light device was measured for a color coordinate using a spectroradiometer, and the average thereof was calculated. The changed degree with respect to the initial color coordinate (CIE coordinate) according to a lapse of time was evaluated.

Light transmittance: liquid composition for an encapsulant was cured at 150° C. for 2 hours to provide a cured specimen in a thickness of 4 mm and measured for a transmittance using a UV-spectrophotometer (Shimadzu Corporation UV-3600) at a wavelength of 450 nm.

Phosphor precipitation degree: phosphor having a density of 5.03 g/cm$^3$ was added into the composition for an encapsulant in a ratio of 19% based on the weight of the composition for an encapsulant, and mixed and defoamed by using ARV-310 (manufactured by Thinky) at 2,000 rpm for 1.5 minutes, and at 800 rpm for 3.5 minutes. The mixture was introduced into a vial only for Turbiscan having an exterior diameter of 27.4 mm and measured for a light back scattering spectrum using a Turbiscan equipment (manufactured by Formulation, Turbiscan lab) in a regular time interval (5 or 10 minutes) right after the mixing. The changed degree was evaluated by comparing the initial spectrum according to the position (height) of vial in a lapse of time and evaluated.

TABLE 1

|  |  | Ex. 1 | Ex. 2 | Ex. 3 | Comp. Ex. 1 | Comp. Ex. 2 | Comp. Ex. 3 |
|---|---|---|---|---|---|---|---|
| Siloxane compound of Synthesis Ex. 1 (wt %) | | 13 | 8 | 0 | 25 | 20 | 0 |
| Siloxane compound of Synthesis Ex. 2 (wt %) | | 5 | 8 | 13 | 0 | 0 | 11 |
| Siloxane compound of Synthesis Ex. 3 (wt %) | | 82 | 84 | 87 | 75 | 80 | 89 |
| Hydrosilylation catalyst | | 5 ppm | 5 ppm | 5 ppm | 5 ppm | 5 ppm | 5 ppm |
| Encapsulant appearance (before curing) | | transparent | transparent | transparent | transparent | transparent | transparent |
| Encapsulant appearance (after curing) | | transparent | transparent | transparent | transparent | transparent | transparent |
| Curing condition | | 150° C./2 hours | | | | | |
| Viscosity (mPa · s) (encapsulant) | | 4100 | 6600 | 9300 | 1800 | 2600 | 12000 |
| Viscosity (mPa · s) (including phosphor) | | 4300 | 6900 | 9800 | 1900 | 2900 | 13000 |
| Refractive index | | 1.53 | 1.53 | 1.53 | 1.53 | 1.53 | 1.53 |
| Light transmittance (%) | | >95 | >95 | >95 | >95 | >95 | >95 |
| Dispensing process pressure (needle 25 G, kPa for 0.5 sec) | | 2.6 | 3.2 | 4.8 | 1.8 | 2.1 | unmeasurable |
| Phosphor precipitation degree | | 16.3% | 8.2% | 0.9% | 27% | 19.1% | 0.3% |
| Color coordinate variation ratio | CIE x | 0.0015 | 0.0012 | 0.0005 | 0.0063 | 0.0032 | — |
| | CIE y | 0.0022 | 0.0016 | 0.0009 | 0.0075 | 0.0039 | — |

The mixtures of mixing the compositions for an encapsulant according to Comparative Example 1 to Comparative Example 3 and Example 1 to Example 3 with phosphor were measured for a phosphor precipitation degree, and the results are shown in FIGS. 2 to 7. In addition, FIGS. 8 to 12 show the color coordinate distribution according to time of the light device fabricated by applying each the mixture. The case of Comparative Example 3 had too high viscosity to be coated on the package, so the device was not fabricated. Therefore, the color coordinate graph when applied by the composition of Comparative Example 3 does not exist.

Referring to Table 1 and FIGS. 2 to 12, when the compositions for an encapsulant according to Examples 1 to 3 having a viscosity of 4,000 mPa·s to 9,500 mPa·s under atmospheric pressure at 23° C. were mixed with phosphor having a density of about 5.03 g/cm$^3$ in a ratio of 19% based on the weight of the composition for an encapsulant and allowed to stand at 23° C. for about 2 hours, the phosphor was precipitated in an amount of less than or equal to about 18%, and the color coordinate of the light emitting devices fabricated with the encapsulant obtained by curing each the mixture was also very narrow wherein the values of both x-axis and y-axis were each less than or equal to 0.0020. Thus, the compositions for an encapsulant according to Examples 1 to 3 may suppress the precipitation of phosphor included therein at a room temperature for a predetermined time for coating the same on the package, for example, for 2 hours, within a predetermined range, thereby to provide a reliable light emitting device having no substantial color difference among the fabricated light devices.

Figure 8:
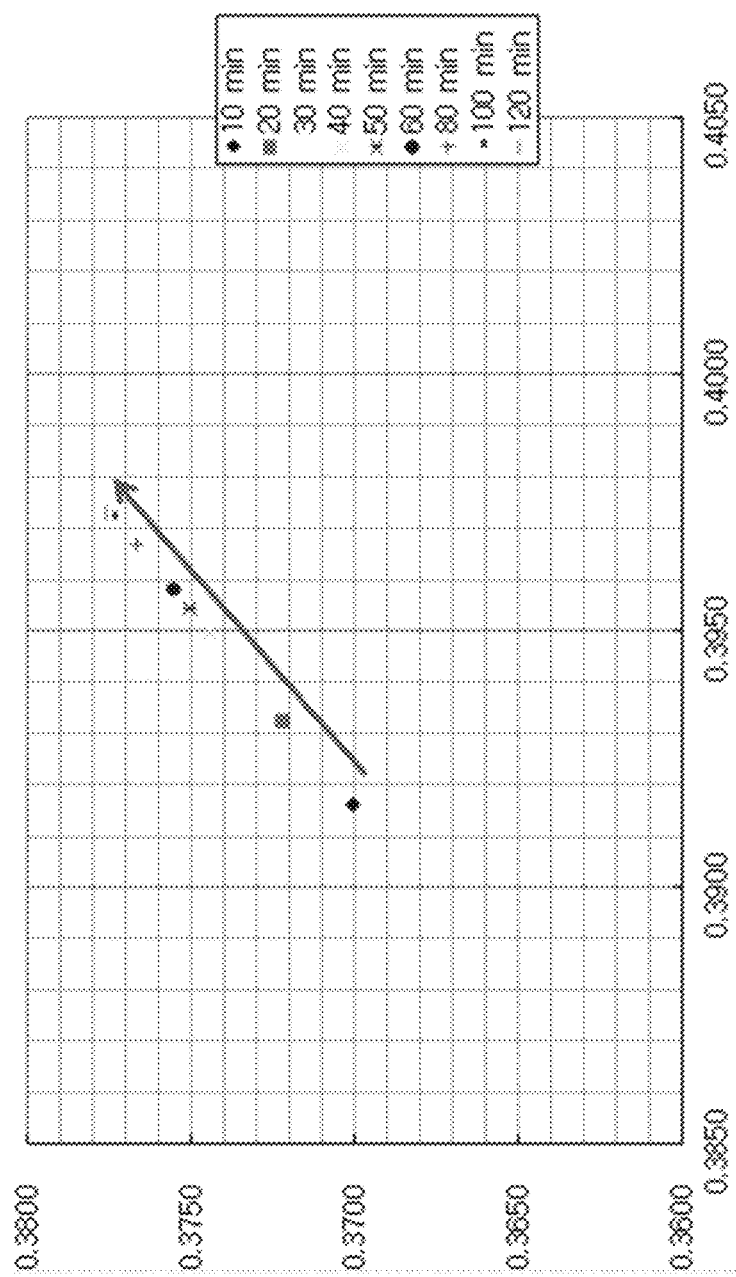
FIG. 8 illustrates a color coordinate graph of the light devices measured in a regular time interval using a spectroradiometer when the composition for an encapsulant according to Comparative Example 1 is mixed with phosphor and coated onto each of five packages in a 5 minute interval in a predetermined amount to provide a light device.
Figure 9:
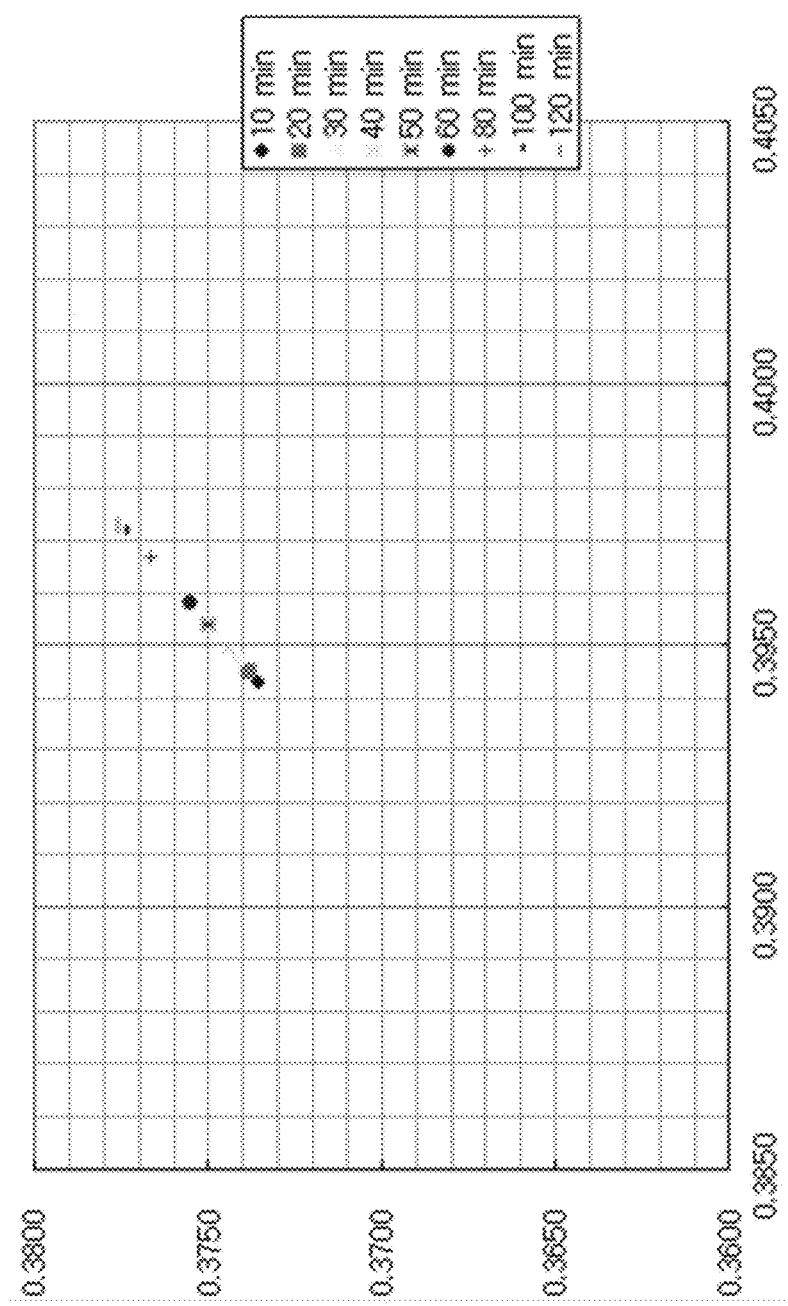
FIG. 9 illustrates a color coordinate graph of the light devices measured in a regular time interval using a spectroradiometer when the composition for an encapsulant according to Comparative Example 2 is mixed with phosphor and coated onto each of five packages in a 5-minute interval in a predetermined amount to provide a light device.
Figure 10:
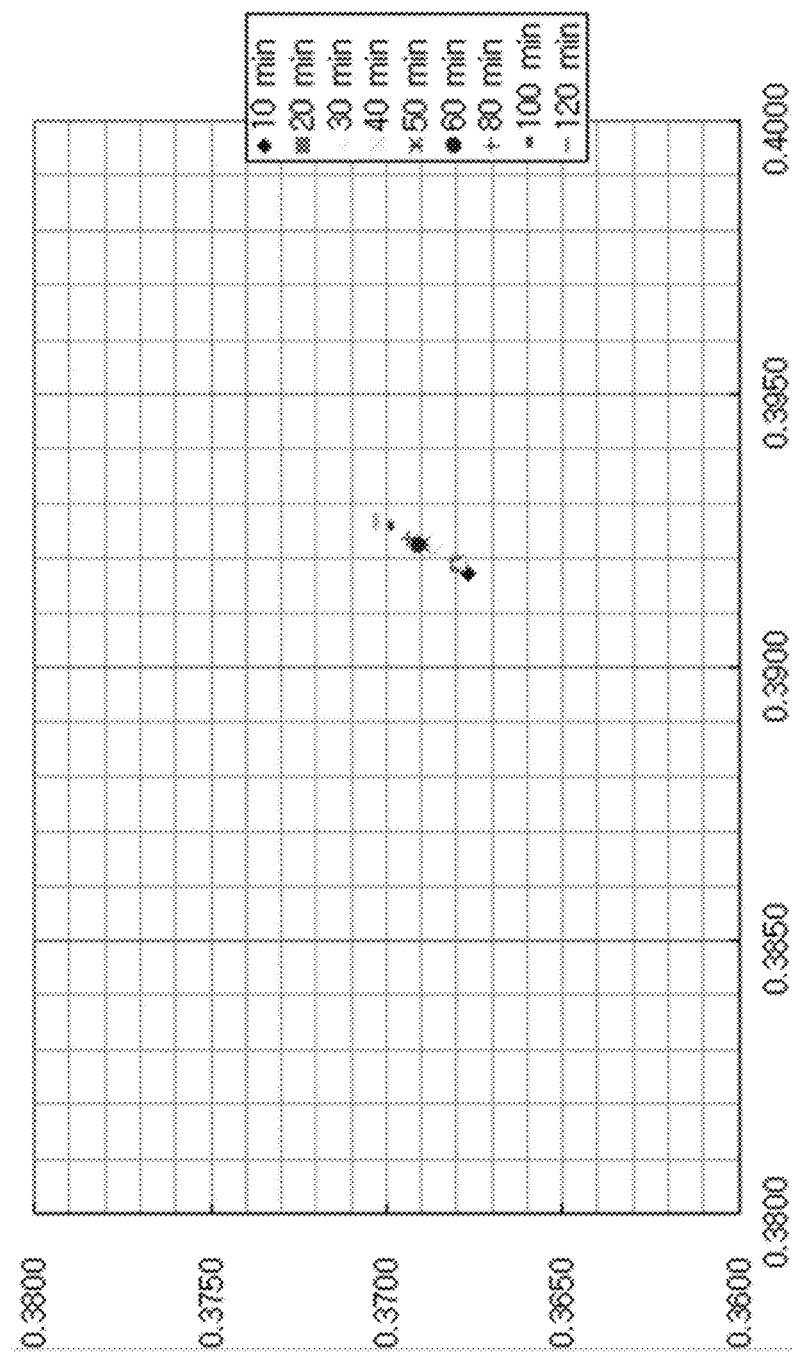
FIGS. 10 to 12 illustrate color coordinate graphs of the light devices measured in a regular time interval using a spectroradiometer when the compositions for an encapsulant according to Example 1 to Example 3 are mixed with phosphor and each coated onto five packages in a 5-minute interval in a predetermined amount to provide light devices.
Figure 11:
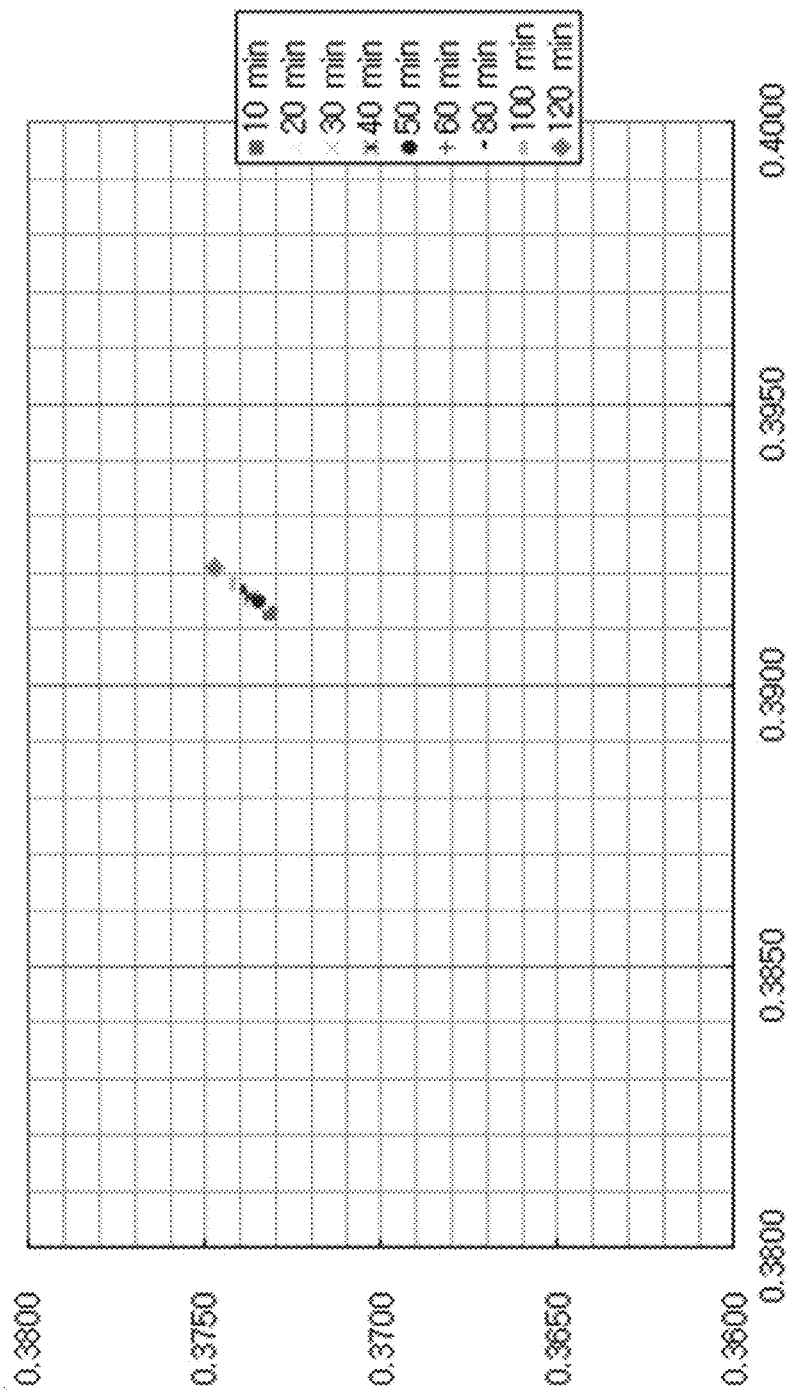
Figure 12:
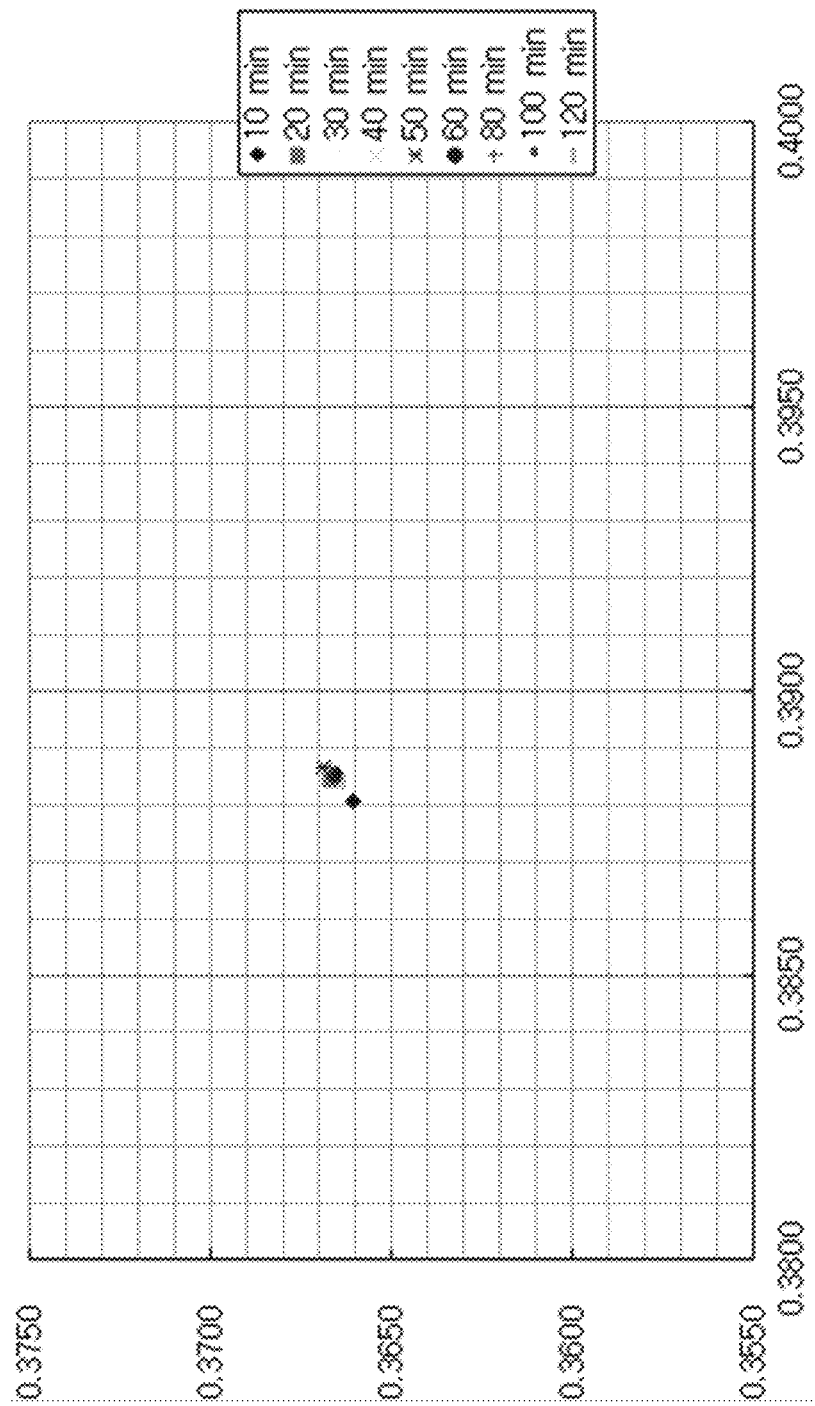

On the other hand, when the composition for an encapsulant according to Comparative Example 1 having a viscosity of 1,800 mPa·s, which is out of the viscosity range, was added with the same phosphor in the same amount, 27% of phosphor was precipitated when allowed to stand at the same temperature for the same time. It shows that the precipitating speed of phosphor was very fast, thus the light emitting device fabricated from the mixture had a high color difference caused by the phosphor content difference among devices according to the fabrication time, as shown in FIG. 8.

On the other hand, when the composition according to Comparative Example 3 having a viscosity of 12,000 mPa·s included the same phosphor, the precipitating amount of phosphor was very low as 0.3% for the same time, but the mixture of encapsulant and phosphor could not be coated on the package through a syringe due to the high viscosity, such that it was impossible to fabricate a light emitting device.

As described above, when the composition for an encapsulant according to an embodiment is mixed with phosphor to fabricate a light device, phosphor precipitation may be prevented to reliably provide a light emitting device; in addition, as shown in Table 1, it may satisfy all other characteristics required for an encapsulant for a light emitting device, such as a refractive index, a light transmittance, a process pressure, or the like. Embodiments may provide an encapsulant that prevents gas and moisture intrusion, and provides uniform phosphor distribution and minimizes color changes among devices. By suppressing the phosphor precipitation in the encapsulant for at least a predetermined time during fabricating an electronic device, the encapsulant may provide a reliable electronic device having a uniform phosphor content among devices without color difference.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

| <Description of symbols> | |
|---|---|
| 110: mold | 120: frame |
| 140: light emitting diode chip | 150: bonding wire |
| 200: encapsulant | |

What is claimed is:

1. A phosphor-containing mixture, comprising:
a composition comprising:
a first siloxane compound having a silicon-bonded hydrogen, and a second siloxane compound having a silicon-bonded alkenyl group,
wherein: the first siloxane compound is included in an amount of less than about 50wt % based on the total amount of the first siloxane compound and the second siloxane compound, and the second siloxane compound is included in an amount of greater than about 50wt % based on the total amount of the first siloxane compound and the second siloxane compound, and a siloxane mixture consisting of the first siloxane compound, the second siloxane compound, and a hydrosilylation catalyst has a viscosity of about 4,000 to about 10,000 mPa·s when measured using a Brookfield (DV-II+pro) spindle No. 52 at a torque of about 90% under atmospheric pressure at about 23° C.; and a phosphor having a density of about 3.5 g/cm³ to about 6.5 g/cm³, the phosphor being present in an amount of about 5% to about 40% based on the weight of the composition,
wherein the siloxane mixture, when combined with the phosphor and allowed to stand at about 23° C. for greater than or equal to about 2 hours, exhibits a phosphor precipitation degree of about 18% or less.

2. The phosphor-containing mixture according to claim 1, wherein the phosphor precipitation degree is determined by:
measuring a light back scattering spectrum of the siloxane mixture of the composition and the phosphor, the light back scattering spectrum being evaluated in a vertical direction over time using a Turbiscan equipment,
comparing each measurement value with an initial spectrum, and
evaluating the changed degree.

3. The phosphor-containing mixture according to claim 1, wherein the composition has a transmittance, after curing the composition, of greater than or equal to about 90% at a wavelength of about 450 nm.

4. The phosphor-containing mixture according to claim 1, wherein the composition has a refractive index, before curing the composition, of greater than or equal to about 1.40 at 589 nm.

5. The phosphor-containing mixture according to claim 1, wherein the first siloxane compound is represented by Chemical Formula 1:

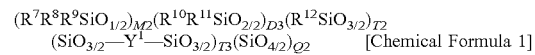

[Chemical Formula 1]

wherein, in Chemical Formula 1,
$R^7$ to $R^{12}$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof,
at least one of $R^7$ to $R^{12}$ includes hydrogen,
$Y^1$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, 0<M2<1, 0≤D3<1, 0≤T2<1, 0≤T3<1, 0≤Q2<1, and M2+D3+T2+T3+Q2=1.

6. The phosphor-containing mixture according to claim 5, wherein at least one of the $R^7$ to $R^{12}$ includes a substituted or unsubstituted C6 to C30 aryl group.

7. The phosphor-containing mixture according to claim 1, wherein the second siloxane compound is represented by Chemical Formula 2:

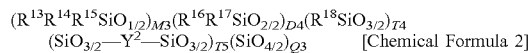  [Chemical Formula 2]

wherein, in Chemical Formula 2, $R^{13}$ to $R^{18}$ are independently a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^{13}$ to $R^{18}$ includes a substituted or unsubstituted C2 to C30 alkenyl group, $Y^2$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, 0<M3<1, 0≤D4<1, 0≤T4<1, 0≤T5<1, 0≤Q3<1, and M3+D4+T4+T5+Q3=1.

8. The phosphor-containing mixture according to claim 7, wherein at least one of the $R^{13}$ to $R^{18}$ includes a substituted or unsubstituted C6 to C30 aryl group.

9. The phosphor-containing mixture according to claim 1, wherein the siloxane mixture has a viscosity of about 4,000 to about 9,500 mPa·s when measured using a Brookfield (DV-II+pro) spindle No. 52 at a torque of about 90% under atmospheric pressure at about 23° C.

10. An encapsulant obtained by curing the phosphor-containing mixture according to claim 1.

11. An electronic device comprising the encapsulant as according to claim 10.

* * * * *